United States Patent [19]

Usami et al.

[11] Patent Number: 4,932,034
[45] Date of Patent: Jun. 5, 1990

[54] DISTRIBUTED FEEDBACK SEMICONDUCTOR LASER DEVICE AND CURRENT INJECTION

[75] Inventors: Masashi Usami; Shigeyuki Akiba, both of Tokyo; Yuichi Matsushima, Tanashi, all of Japan

[73] Assignee: Kokusai Denshin Denwa Kabushiki Kaisha, Tokyo, Japan

[21] Appl. No.: 414,585

[22] Filed: Sep. 27, 1989

Related U.S. Application Data

[63] Continuation of Ser. No. 314,483, Feb. 23, 1989, abandoned.

[30] Foreign Application Priority Data

Mar. 11, 1988 [JP] Japan .................. 63-56246

[51] Int. Cl.$^5$ .................. H01S 3/08; H01S 3/19
[52] U.S. Cl. .................. 372/96; 372/44; 372/38; 372/32; 372/46
[58] Field of Search .................. 372/96, 44, 38, 32, 372/46, 29, 108

[56] References Cited

U.S. PATENT DOCUMENTS

| 4,101,845 | 7/1978 | Russer ................... 372/96 |
| 4,751,719 | 6/1988 | Mito et al. ............... 372/96 |
| 4,802,187 | 1/1989 | Bouley et al. ............. 372/96 |

FOREIGN PATENT DOCUMENTS 0078488  5/1983  Japan ..................... 372/96

*Primary Examiner*—William L. Sikes
*Assistant Examiner*—Georgia Y. Epps
*Attorney, Agent, or Firm*—Emmanuel J. Lobato; Robert E. Burns

[57] ABSTRACT

A distributed feedback semiconductor device is disclosed which has a diffraction grating disposed near a light emitting active layer, a double hetero structure with the active layer sandwiched between n- and p-type semiconductors and n- and p-side electrodes for injection a current into the active layer, one of the n- and p-side electrodes being divided into a plurality of electrodes, and in which a current is injected into the active layer across the n- and p-side electrodes for laser oscillation to obtain output light. A first current source is connected to each of electrodes into which one of the n- and p-side electrodes is divided, and a second current source is connected to the divided electrodes via resistors, for injecting a current into the active layer in a desired ratio. The first and second current sources are controlled in accordance with the light emitting state of the active layer. In operation, a current is injected into the active layer through the divided electrodes while controlling the injected-current density in the active layer to be uniform in the direction of travel of light until the injected current reaches a threshold current at which the distributed feedback semiconductor laser device starts to oscillate, and a current thereafter injected while controlling the injected-current density to be maximum in at least that region of the active layer in which the light intensity is maximum in the direction of travel of light.

12 Claims, 4 Drawing Sheets

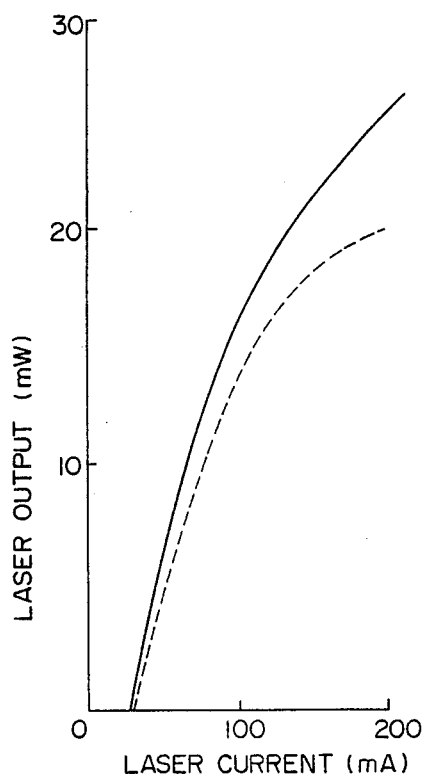

4,932,034

DISTRIBUTED FEEDBACK SEMICONDUCTOR LASER DEVICE AND CURRENT INJECTION

This is a continuation of application Ser. No. 07/314,483, filed Feb. 23, 1989 now abandoned.

BACKGROUND OF THE INVENTION

The present invention relates to a distributed feedback semiconductor laser having a diffraction grating and a current injection method therefor.

In an ordinary semiconductor laser, light intensity in its active layer during oscillation is distributed nonuniformly in the direction of travel of light (hereinafter referred to as the "axial direction"). The nonuniformity of light intensity in the axial direction is particularly remarkable in a phase shifted distributed feedback semiconductor laser (hereinafter referred to as the "phase shifted DFB laser") which has incorporated therein a phase shifted diffraction grating of excellent wavelength selectively. It has been reported that, in the case of such a nonuniform distribution of light intensity, if the injected current density distribution is uniform, the refractive index varies owing to spatial hole burning in the axial direction, by which a threshold gain difference between a main mode and a sub-mode (hereinafter referred to as the "oscillation threshold value gain difference"), which is an index of a single-wavelength operation, varies with an increase in the amount of current injected (see Soda et al., IEEE J. Quantum Electron., Vol. QE-23, pp 804–814, 1987.) That is to say, the higher the light intensity, the more carriers are consumed by stimulated emission, and consequently, the carrier density in that region decreases relative to the light intensity, with the result that the carrier density has, in the axial direction, a nonuniform distribution reverse from the light intensity distribution. On the other hand, the refractive index of semiconductor varies with the internal carrier density and decreases (or increases) when the carrier density becomes high (or low). Therefore the refractive index also has a distribution depending on the nonuniform carrier density distribution. It has been observed not only that this refractive index variation decreases the threshold gain difference, which leads to degradation of the single-wavelength operation, but also that the carrier density variation makes the laser output light readily saturable during a high output operation of the laser.

The present inventors have filed a patent application on a light semiconductor device of a structure in which its electric resistance ratio is distributed nonuniformly and the injected current density is distributed substantially in proportion to the light intensity distribution in the axial direction so as to avoid the above-mentioned problems (Japan. patent application No. 168314/87). This is intended to obtain substantially uniform net carrier density distribution and refractive index distribution by providing an injected current density distribution substantially opposite in direction from the carrier density distribution made nonuniform by spatial hole burning in the axial direction. With such a structure, it is possible to decrease the refractive index variation by spatial hole burning in the axial direction which increases with the current being injected. However, no matter what electric resistance ratio distribution (or injection current density distribution) may be used, a change in the injected current inevitably causes some variations in the refractive index in the axial direction, and consequently, the above-mentioned structure cannot be applied to the case where the dynamic range of current is selected so large.

According to the above method, the injected current density distribution is fixed independently of the current being injected, and consequently, the distribution remains unchanged even during the injection of current below the threshold current. On the other hand, the refractive index variation by hole burning does not occur until oscillation; so that when the injected current is smaller than the threshold current, the refractive index will be changed by the nonuniform injected current density distribution alone. Because of this refractive index variation, the injection of current of an arbitrary value greater than the threshold current does not provide an injected current density distribution which always completely cancels the refractive index variation by hole burning.

As described above, the conventional semiconductor laser device utilizing nonuniform current injection and the current injection method therefor cannot completely suppress the refractive index variation by spatial hole burning in the axial direction, and hence incur deterioration of the single-wavelength selectively and liability to saturation of the laser output light at the time of high current injection, leading to the problem that no stable laser output can be obtained.

SUMMARY OF THE INVENTION

An object of the present invention is to provide a distributed feedback laser device and its current injection method which overcome the above-mentioned defects of the prior art and ensure the stable laser output.

According to an aspect of the present invention, in a distributed feedback semiconductor laser device which has a diffraction grating disposed near a light emitting active layer, a double hetero structure with the active layer sandwiching between n- and p-type semiconductors, and n- and p-side electrodes for injecting a current into the active layer, one of the n- and p-side electrodes is divided into a plurality of electrodes, a first current source is connected to the divided electrodes, a second current source is also connected to the divided electrodes but via resistors for injecting a current into the active layer at a desired current ratio, and the first and second current sources are controlled in accordance with the state of light emission of the active layer.

According to another aspect of the present invention, in a current injection method for a distributed feedback, semiconductor laser device which has a diffraction grating disposed near a light emitting active layer, a double hetero structure with the active layer sandwiched between n- and p-type semiconductors, and n- and p-side electrodes for injecting current into the active layer, one of the n- and p-side electrodes being divided into a plurality of electrodes, and in which a current is injected into the active layer across the n- and p-side electrodes to oscillate the laser device to obtain therefrom output light, there are included a first step of injecting a current into the active layer through the divided electrodes while controlling the injected current density in the active layer to be uniform in the axial direction until the injected current reaches a threshold current at which the laser device starts to oscillate, and a second step of injecting a current thereafter while controlling the injected current density to be maximum in at least that region of the active layer in which the light intensity is maximum in the axial direction.

BRIEF DESCRIPTION OF THE DRAWINGS

The present invention will be described in detail below in comparison with prior art with reference to the accompanying drawings, in which:

FIG. 3 is a graph showing laser current-laser output characteristics of this invention laser and the conventional one.

DETAILED DESCRIPTION

To make differences between prior art and the present invention clear, characteristics of prior art will first be described.

Figure 1:
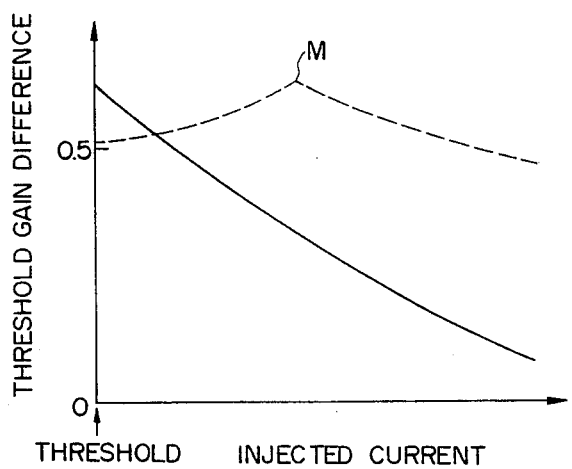
FIG. 1 is a graph showing the results of calculation of the injection current dependence of the threshold gain difference of a conventional quarter-wave phase shifted DFB laser.

FIG. 1 shows the injected current dependence of the threshold value gain difference in the cases of a uniform current injection into a conventional quarter-wave shifted DFB laser (indicated by the solid line) and a current injection thereinto with a distribution proportional to the light intensity distribution (indicated by the broken line). It appears from FIG. 1 that the uniform current injection causes a monotonous decrease in the threshold current gain difference with an increase in the current and that control of the injected current density makes it possible to maintain a large threshold gain difference until high current injection as compared with the case of not effecting such control, whereby the refractive index variation by hole burning is suppressed to some extent. In this instance, the injected current of a maximum value (M) is present in the threshold gain difference, and at this current value, the refractive index variations by hole burning and nonuniform current injection are completely cancelled each other, but in a lower current region the effect by the nonuniform current injection is predominant and in a higher current region the effect by the hole burning is predominant. On this account, the threshold gain difference decreases not only at the threshold current but also at the high current injection. While the above has shown a case where the injected current density distribution is in proportion to the light intensity distribution, the above-mentioned tendency will still persist even if the degree of nonuniformity of the current injection is changed or other similar distributions are employed.

With reference to the accompanying drawings, the present invention will hereinafter be described in detail. In the following, the same parts will be identified by the same reference numerals and no duplicate description will be given thereof.

(EMBODIMENT 1)

Figure 2A:
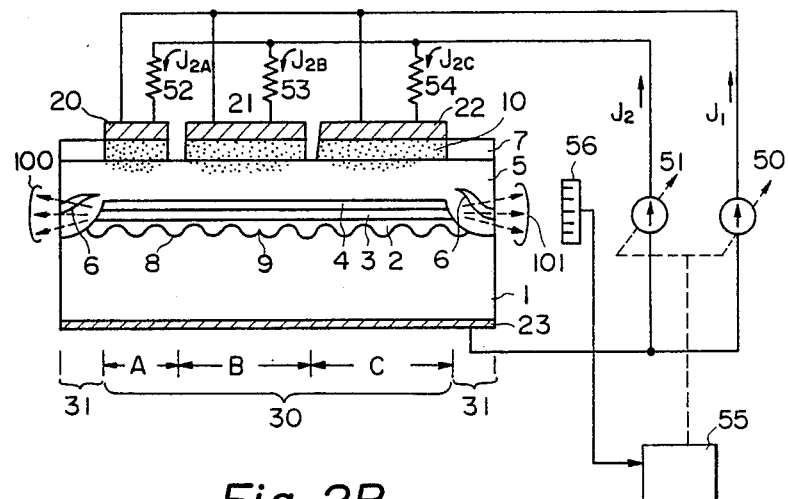
FIGS. 2A, 2B and 2C are a block diagram illustrating the construction of the quarter-wave phase shifted DFB laser of the present invention, a graph showing its light intensity distribution and current density distribution, and a graph showing its injection current dependence of the threshold gain difference, respectively.

FIG. 2A illustrates the construction of an asymmetric quarter-wave shifted DFB laser device according to a first embodiment of the present invention. The asymmetric quarter-wave shifted DFB laser of this embodiment has a structure in which an n-type InGaAsP waveguide layer 2, an InGaAsP active layer 3, a p-type InGaAsP buffer layer 4 and p-type InP clad layer 5 are laminated on an n-type InP substrate 1 and a laser region 30 is formed by a diffraction grating 8 which has a quarter-wave phase shift point 9 provided by periodically changing the film thickness of the n-type InGaAsP waveguide layer 2 and causes an effective periodic refractive index variation accordingly. Referance numeral 100 indicates forward laser output light (hereinafter referred to simply as the "forward output light") and 101 backward laser output light (hereinafter referred to simply as the "backward output light"). The quarter-wave phase shift point 9 is located a little to the side of the forward output light 100 relative to the center of the laser region 30 so that the forward output light 100 becomes larger than the backward output light 101. The laser region 30 is divided into a region B near the quarter-wave phase shift point 9 and regions A and C near opposite end faces of the laser, and their lengths are selected in the ratio of A:B:C=2:4:4, for example. On the other hand, the active layer 3 is closed at its both ends with the p-type InP clad layer 5 and a p-type layer 6 of a greater energy gap than that of the active layer 6, forming window regions 31. Further, the overlapping portions of the laser region 30 and the window regions 31 are each overlaid with a p-type InGaAsP cap layer 7 for ohmic contact with an electrode. Reference numerals 20, 21 and 22 indicate p-side electrodes made of Au/Cr, and these electrodes correspond to the regions A, B and C, respectively. Reference numeral 23 denotes an n-side electrode made of Au/AuSn, 10 zinc diffused regions for reducing the contact resistance with the electrodes, 50 and 51 current sources for laser driving use, and 52, 53 and 54 resistors for injecting currents into the respective regions in a desired ratio ($J_{2A}:J_{2B}:J_{2C}$). A portion of the backward output light 101 is absorbed by a photodiode 56, which has its output connected to a current controller 55 which controls the current sources 50 and 51.

Table 1 shows the relationships between the current sources 50 and 51 and the photodiode 56. In connection with this embodiment, a description will be given of a current injection method which gradually increases the injection current from zero until the DFB laser oscillates.

(1) When the DFB laser is not in oscillation, that is, when the photodiode 56 yields no outputs, the current controller 55 controls the current source 51 not to produce its output and the current source 50 to yield a gradually increasing an injection current.

(2) Next, the output of the current source 50 is fixed by the current controller 55 at a time point when the DFB laser starts to oscillate, that is, at the instant when the protodiode 56 yields the output.

(3) The current, which is injected for raising the level of the output light created by the oscillation of the DFB laser to obtain a stable output light, is controlled by the current source 51 having connected thereto the resistors 52, 53 and 54 of predetermined resistance values so that the afore-mentioned injected current density becomes maximum in that region of the active layer where the light intensity is maximum in the axial direction.

By the above three steps, when the injection current is below the threshold current, the current is injected into the respective regions with a uniform current density, and when the injection current is above the threshold current, the current exceeding the threshold value current is injected with a current density distribution corresponding to the light intensity distribution through control of the values of the resistors 52, 53 and 54.

TABLE 1

| Photodiode output | Current source 50 | Current source 51 |
|---|---|---|
| No | Controlled | $J_2 = 0$ |
| Yes | Fixed to a value at the time of threshold current | Controlled |

Figure 2B:
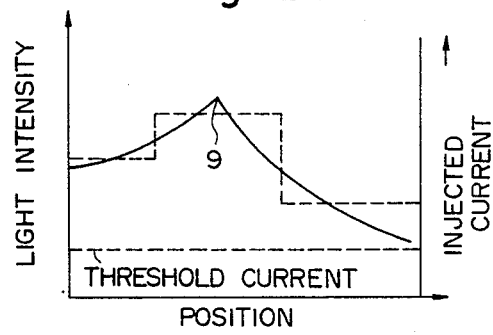

FIG. 2B is a graph showing the light intensity distribution and the injected current density distribution characteristic of the present invention in the axial direction in the active layer 3 in FIG. 2A. The light intensity distribution is a nonuniform one in which the light intensity is maximum at the quarter-wave phase shift point. The current above the threshold current can be distributed in agreement with this light intensity distribution by injecting the current into the respective regions in a current density ratio of $J_{2A}:J_{2B}:J_{2C}=2:3:1$, for instance.

Figure 2C:
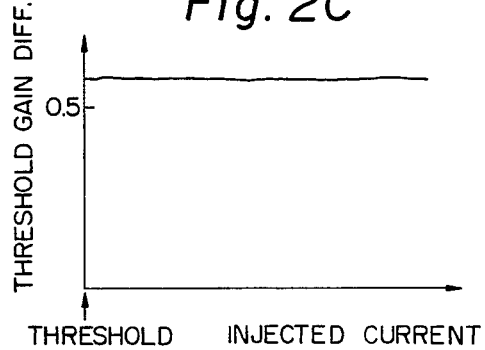

FIG. 2C shows the relationship, obtained by calculation, between the threshold gain difference and the injected current at the time of current injection with the distribution depicted in FIG. 2B. As will be seen from FIG. 2C, the threshold value gain difference remains substantially constant at a large value regardless of the current injected, indicating substantially complete suppression of the spatial hole burning in the axial direction. Thus, the present invention is supported theoretically as well. Further, the number of division of the p-side electrode is required to be at least three in the case of the quarter-wave phase shifted DFB laser; namely, the p-side electrode needs only to be divided into a plurality of electrodes so that they lie on the right side and the left side of the electrode 21 overlying the phase shift portion of the diffraction grating (i.e. in the directions of travel of light).

FIG. 3 shows the relationships between the forward output current 100 and the injection current in the same device measured in the cases where a current was injected uniformly (indicated by the broken line) and where the current was injected with a current density distribution of $J_{2A}:J_{2B}:J_{2C}=2:3:1$ as in the above-described embodiment (indicated by the solid line). It has been ascertained that the present invention improves the differential quantum efficiency and maximum output of the forward output light and ensures oscillation of almost all devices at single wavelengths.

(EMBODIMENT 2)

Figure 4A:
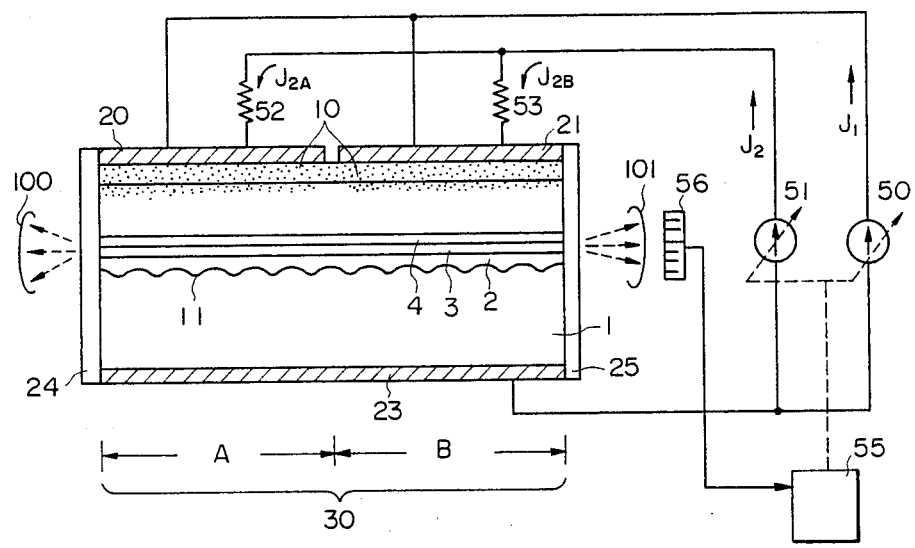
FIGS. 4A and 4B are block diagram illustrating a second embodiment of the DFB laser of the present invention and a graph showing its light intensity distribution and current density distribution.

FIG. 4A illustrates a second embodiment of the present invention. This embodiment differs from the first embodiment in that a diffraction grating 11 has no quarter-wave phase shift portion, that no window region is provided at either end of the active layer 3, that the end facet from which the forward output light 100 is emitted is coated with a non-reflective coating film 24, that the end facet from which the backward output light 101 is emitted is coated with a lightly reflective coating film 25, and that the p-side electrode and the laser region 30 are both divided into two. That is, when no phase shift portion is provided, at least one electrode needs only to be provided at the side of each end facet.

Sometimes such a DFB laser does not oscillate at a single wavelength according to the phase of the diffraction grating at either end facet. However, this laser is effective for use in obtaining a high forward output light, because the ratio of the forward output light 100 to the backward output light 101 can be selected large.

Figure 4B:
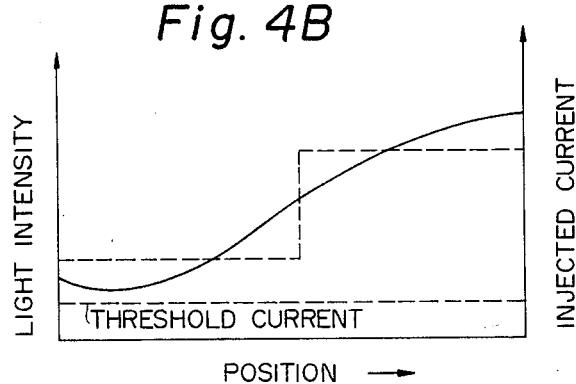

FIG. 4B is a graph showing, by way of example, the light intensity distribution in the axial direction (indicated by the full line) and the injected current density distribution (indicated by the broken line) characteristics of the present invention, in the active layer 3 of the laser shown in FIG. 4A. When the current density ratio for current exceeding the threshold value is selected so that, for example, $J_{2A}:J_{2B}=1:2$, the actual carrier density distribution can be made substantially uniform and no spatial hole burning in the axial direction will occur. Consequently, even during injection of a light current the forward output light 100 will not be saturated and the single wavelength selectivity will also be improved as in Embodiment 1.

While in Embodiments 1 and 2 the numbers of divided electrodes are three and two, respectively, a further increase in the number of divided electrodes will permit more complete suppression of the hole burning. Furthermore, even if the current density distribution of the respective laser regions for the current exceeding the threshold current is not completely in proportion to the light intensity distribution, the output characteristic of the laser could appreciably be improved by simply increasing the current density in the region near the quarter-wave phase shift point 9 (the region B in Embodiment 1) where the light intensity is particularly high, or in the end facet portion of the laser region 30 (the region B in Embodiment 2) to a value 1.2 to 3.0 times greater than in the other regions.

Although the present invention has been described to use semiconductor materials of the InGaAsP/InP system, the invention is also easily applicable to other semiconductor materials as of the AlInGaAs/InP and AlGaAs/GaAs systems.

As described above, a DFB laser device of stable output can be materialized through current control by the first and second current sources 50 and 51 which are connected to each of the divided electrodes. Moreover, according to the present invention, the current density distribution is controlled so that during injection of a current below the threshold current the current density is uniform in the axial direction and that during injection of a current above the threshold current, the density of current exceeding the threshold current density, in the axial direction, is high in at least the region of a maximum light intensity. This suppresses the occurence of the spatial hole burning in the axial direction, and consequently, it is possible to obtain a DFB laser which is of less output saturation during the high output operation and oscillates at a single wavelength with a high probability.

The output light of the phase shifted DFB laser can be controlled very stable by providing two or more electrodes at both sides of the electrode 21 overlying the region where the diffraction grating 8 has the phase shift point 9.

The high output of the phase shifted DFB laser can be stabilized by maximizing the current density in the electrode 21 overlying the region where the diffraction grafting 8 has the phase shift point 9.

In the DFB laser with no phase shift point a stable high output can be obtained by dividing the electrode into two or more with respect to the center of the active layer 3.

Besides, the present invention ensures the obtaining of a stable high output of the DFB laser through three-step control of current injection.

Hence, the present invention is of very wide use in the fields of optical communication and optical data processing and is of great utility in practical use.

What we claim is:

1. A distributed feedback semiconductor laser device which is provided with a diffraction grating provided near a light emitting active layer, a double hetero structure with the active layer sandwiched between n- and p-type semiconductors, and n- and p-side electrodes for injecting a current into the active layer, characterized by the provision of:
    a first current source connected to each of electrodes into which one of the n- and p-side electrodes is divided; and
    a second current source connected to the divided electrodes via resistors, for injecting a current into the active layer in a desired ratio;
    the first and second current sources being controlled in accordance with the light emitting state of the active layer.

2. A distributed feedback semiconductor laser device according to claim 1, characterized in that the first current source injects a current into the active layer uniformly via the divided electrodes and the second current source injects a current into the active layer via the divided electrodes so that the current density is maximum in that region of the active layer where the light intensity is higher than in the other regions.

3. A distributed feedback semiconductor laser device according to claim 1, characterized in that one of the divided electrodes is disposed on that region of the active layer where the diffraction grating has a phase shift point.

4. A distributed feedback semiconductor laser device according to claim 3, characterized in that the current density in the region where the diffraction grating has the phase shift point becomes higher than in the other regions of the active layer.

5. A distributed feedback semiconductor laser device according to claim 1, characterized in that the one of the divided electrodes is disposed in the center of the active layer.

6. A current injection method for a distributed feedback semiconductor laser device which has a diffraction grating disposed near a light emitting active layer, a double hetero structure with the active layer sandwiched between n- and p-type semiconductors and n- and p-side electrodes for injection a current into the active layer, one of the n- and p-side electrodes being divided into a plurality of electrodes, and in which a current is injected into the active layer across the n- and p-side electrodes for laser oscillation to obtain output light, characterized by the inclusion of:
    a first step of injecting a current into the active layer through the divided electrodes while controlling the injected-current density in the active layer to be uniform in the direction of travel of light until the injected current reaches a threshold current at which the distributed feedback semiconductor laser device starts to oscillate; and
    a second step of injecting a current thereafter while controlling the injected-current density to be maximum in at least that region of the active layer in which the light intensity is maximum in the direction of travel of light.

7. A distributed feedback semiconductor laser device comprising: a diffraction grating provided near a light emitting active layer, a double hetero structure with the active layer sanwiched between an n-type semiconductor and a p-type semiconductor, and an n-side electrode and a p-side electrode one of which is divided into several electrodes for injecting a current into the active layer,
    characterized by the provision of:
    a first current source connected to each of said several divided electrodes into which one of the n-side electrode and the p-side electrode is divided;
    a plurality of resistors equal in number to said several divided electrodes and connected thereto;
    a second current source connected to the divided electrodes via corresponding resistors, for injecting a current into the active layer at a desired ratio in current density for each of the divided electrodes; and
    control means comprising a photodiode disposed for absorbing a backward output light from the active layer to produce output light employed for controlling the first current source and the second current source in accordance with the light emitting state of the active layer.

8. A distributed feedback semiconductor laser device according to claim 7, characterized in that the first current source is connected directly to said divided electrodes and injects a current into the active layer uniformly via the divided electrodes, and the second current source injects a current into the active layer via the divided electrodes so that the current density is maximum in that region of the active layer where the light intensity is higher than in the other regions.

9. A distributed feedback semiconductor laser device according to claim 7, characterized in that a center one of the divided electrodes is disposed overlying a region of the active layer where the diffraction grating has a phase shift point.

10. A distributed feedback semiconductor laser device according to claim 9, characterized in that the current density in the region where the diffraction grating has the phase shift point is higher than in other regions of the active layer.

11. A distributed feedback semiconductor laser device according to claim 7, characterized in that said one of the divided electrodes overlies the center of the active layer.

12. A current injection method for a distributed feedback semiconductor laser during which has a diffraction grating disposed near a light emitting active layer, a double hetero structure with the active layer sandwiched between n- and p-type semiconductors and n- and p-side electrodes for injecting a current into the active layer, one of the n- and p-side electrodes being divided into a plurality of electrodes, and in which a current is injected into the active layer across the n- and p-side electrodes for laser oscillation to obtain output light, characterized by including of:
    a first step of injecting a current into the active layer through the divided electrodes while controlling the injected-current density in the active layer to be uniform in the direction of travel of light until the injected current reaches a threshold current at which the distributed feedback semiconductor laser device starts to oscillate; and
    a second step of injecting a current into the active layer through the divided electrodes thereafter while controlling the injected-current density to maximize it in that region of the active layer in which the light intensity is maximum in the direction of travel of light.

* * * * *